US008575616B2

(12) United States Patent
Kim

(10) Patent No.: US 8,575,616 B2
(45) Date of Patent: Nov. 5, 2013

(54) THIN FILM TRANSISTOR SUBSTRATE AND METHOD FOR MANUFACTURING THE SAME

(75) Inventor: KiTae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 13/305,435

(22) Filed: Nov. 28, 2011

(65) Prior Publication Data
US 2012/0139045 A1 Jun. 7, 2012

(30) Foreign Application Priority Data

Dec. 6, 2010 (KR) .................. 10-2010-0123715

(51) Int. Cl.
*H01L 29/423* (2006.01)
*H01L 29/786* (2006.01)

(52) U.S. Cl.
USPC ............... 257/72; 257/401; 257/E29.273

(58) Field of Classification Search
None
See application file for complete search history.

(56) References Cited

U.S. PATENT DOCUMENTS

| 6,407,780 | B1* | 6/2002 | Sung | 349/43 |
|---|---|---|---|---|
| 7,303,987 | B2* | 12/2007 | Lim et al. | 438/625 |
| 7,807,486 | B2* | 10/2010 | Kwack | 438/30 |
| 7,833,846 | B1* | 11/2010 | Choi et al. | 438/149 |
| 7,910,414 | B2* | 3/2011 | Choi et al. | 438/158 |
| 8,053,802 | B2* | 11/2011 | Kwack | 257/98 |
| 2004/0266082 | A1* | 12/2004 | You | 438/197 |
| 2007/0269936 | A1* | 11/2007 | Tanaka et al. | 438/133 |
| 2008/0073674 | A1* | 3/2008 | Cho et al. | 257/211 |
| 2008/0138942 | A1* | 6/2008 | Lee et al. | 438/160 |
| 2009/0101908 | A1* | 4/2009 | Kwack | 257/59 |
| 2009/0130789 | A1* | 5/2009 | Park et al. | 438/34 |
| 2009/0311814 | A1* | 12/2009 | You | 438/29 |
| 2009/0321739 | A1* | 12/2009 | Kim et al. | 257/59 |
| 2010/0044717 | A1* | 2/2010 | Choi et al. | 257/72 |
| 2010/0051954 | A1* | 3/2010 | Lin et al. | 257/59 |
| 2010/0123138 | A1* | 5/2010 | Choi et al. | 257/72 |
| 2010/0289023 | A1* | 11/2010 | Choi et al. | 257/59 |
| 2010/0291741 | A1* | 11/2010 | Choi et al. | 438/158 |
| 2012/0267630 | A1* | 10/2012 | Kim et al. | 257/59 |

OTHER PUBLICATIONS

Yamauchi, Noriyoshi, and Rafael Reif. "Polycrystalline Silicon Thin Films Processed with Silicon Ion Implantation and Subsequent Solid-phase Crystallization: Theory, Experiments, and Thin-film Transistor Applications." Journal of Applied Physics 75.7 (1994): 3235.*

* cited by examiner

*Primary Examiner* — Thomas L Dickey
*Assistant Examiner* — Joseph Schoenholtz
(74) *Attorney, Agent, or Firm* — Birch, Stewart, Kolasch & Birch, LLP

(57) ABSTRACT

A thin film transistor substrate and a method for manufacturing the same are discussed, in which the thin film transistor comprises a gate line and a data line arranged on a substrate to cross each other; a gate electrode connected with the gate line below the gate line; an active layer formed on the gate electrode; an etch stopper formed on the active layer; an ohmic contact layer formed on the etch stopper; source and drain electrodes formed on the ohmic contact layer; and a pixel electrode connected with the drain electrode. It is possible to prevent a crack from occurring in the gate insulating film during irradiation of the laser and prevent resistance of the gate electrode from being increased.

6 Claims, 12 Drawing Sheets

THIN FILM TRANSISTOR SUBSTRATE AND METHOD FOR MANUFACTURING THE SAME

CROSS REFERENCE TO RELATED APPLICATIONS

This application claims the benefit of the Korean Patent Application No. 10-2010-0123715 filed on Dec. 6, 2010, which is hereby incorporated by reference for all purposes as if fully set forth herein.

BACKGROUND OF THE INVENTION

1. Field of the Invention

The present invention relates to a thin film transistor substrate that can be applied to a display device such as a liquid crystal display device, and more particularly, to a thin film transistor that crystallizes an active layer by using a laser.

2. Discussion of the Related Art

A thin film transistor has been widely used as a switching device of a display device such as a liquid crystal display device.

The thin film transistor includes a gate electrode, an active layer, and source and drain electrodes, and may be divided into a staggered structure and a coplanar structure depending on arrangement of the electrodes.

In the staggered structure, the gate electrode and the source/drain electrodes are arranged up and down in regard to the active layer, and in the coplanar structure, the gate electrode and the source/drain electrodes are arranged on the same plane.

The thin film transistor of the staggered structure may be divided into a back channel etched (BCE) type thin film transistor and an etch stopper (ES) type thin film transistor depending on a method for forming a channel.

In the back channel etched type thin film transistor, a channel region of a semiconductor layer is etched during an etching process for forming the source and drain electrodes, and in this case, a problem occurs in that the active layer may be too etched. On the other hand, in the etch stopper type thin film transistor, since an etch stopper is formed on a semiconductor layer, a channel region of the semiconductor layer is not etched during an etching process for forming the source and drain electrodes, whereby there is no concern that the active layer may be too etched.

Meanwhile, in manufacturing the etch stopper type thin film transistor, there is provided a method for crystallizing the active layer by using a laser. Hereinafter, the etch stopper type thin film transistor (hereinafter, referred to as 'thin film transistor') according to the related art will be described with reference to the accompanying drawings.

FIGS. 1A to 1E are cross-sectional views illustrating process steps of manufacturing a thin film transistor substrate by crystallizing an active layer using a laser according to the related art.

First of all, as shown in FIG. 1A, a gate electrode 20 is formed on a substrate 10, and a gate insulating film 25 is formed on the entire surface of the substrate including the gate electrode 20.

Next, as shown in FIG. 1B, after an active layer 30a, an etch stopper layer 40a, and a heat transfer layer 45 are sequentially deposited on the gate insulating layer 25, a laser is irradiated to crystallize the active layer 30a.

The heat transfer layer 45 absorbs energy of the laser and transfers the absorbed energy to the active layer 30a. In more detail, since the active layer 30a does not absorb energy well if the laser is directly irradiated to the active layer 30a, a metal material easy to absorb energy of the laser is used to transfer energy to the active layer 30a.

The etch stopper layer 40a serves as a stopper during a later etching process, and also serves to prevent reaction between the metal constituting the heat transfer layer and a silicon material constituting the active layer 30a from occurring during laser irradiation.

Next, as shown in FIG. 1C, after the heat transfer layer 45 is removed, the etch stopper layer 40a is patterned to form a predetermined etch stopper 40.

Next, as shown in FIG. 1D, an ohmic contact layer 50a and a source/drain electrode layer 60a are sequentially deposited on the entire surface of the substrate including the etch stopper 40.

Then, as shown in FIG. 1E, the source/drain electrode layer 60a is patterned to form a source electrode 62 and a drain electrode 64, and the active layer 30a and the ohmic contact layer 50a are etched using the source and drain electrodes 62 and 63 as masks to form an ohmic contact layer 50 and an active layer 30 at a predetermined pattern.

Since the etch stopper 40 is not formed at a left region of the source electrode 62 and a right region of the drain electrode 64, the ohmic contact layer 50a and the active layer 30a are etched together. However, since the etch stopper 40 is formed at a channel region between the source electrode 62 and the drain electrode 64, the ohmic contact layer 50a is only etched.

However, the aforementioned thin film transistor according to the related art has the following problems.

If the laser is irradiated during the process of FIG. 1B, serious stress is given to the gate electrode 20, whereby a crack occurs in the gate insulating film 25 formed on the gate electrode 20.

In order to solve the above problem, the gate electrode 20 may be formed at a thin thickness. However, in this case, problems occur in that resistance of the gate electrode 20 increases and on current characteristics of the thin film transistor may be deteriorated.

SUMMARY OF THE INVENTION

Accordingly, the present invention is directed to a thin film transistor substrate and a method for manufacturing the same that substantially obviates one or more problems due to limitations and disadvantages of the related art.

An advantage of the present invention is to provide a thin film transistor substrate and a method for manufacturing the same in which a gate electrode is formed at a thin thickness to prevent a crack from occurring in a gate insulating film formed on the gate electrode when a laser is irradiated and improve on current characteristics of a thin film transistor without increasing resistance of the gate electrode.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate comprises a gate line and a data line arranged on a substrate to cross each other; a gate electrode connected with the gate line below the gate line; an active layer formed on the gate electrode; an etch stopper formed on the active layer; an ohmic contact layer formed on the etch stopper; source and drain electrodes formed on the ohmic contact layer; and a pixel electrode connected with the drain electrode.

In another aspect of the present invention, a method for manufacturing a thin film transistor substrate comprises the steps of forming a gate electrode on a substrate and forming a gate line on the gate electrode; forming a gate insulating film on the gate line, forming an active layer on the gate insulating film, and forming an etch stopper layer on the active layer; forming a heat transfer layer on the etch stopper layer and crystallizing the active layer by irradiating a laser; removing the heat transfer layer after etching the etch stopper layer using the heat transfer layer as a mask; forming an ohmic contact layer on an entire surface of the substrate including the etch stopper layer and forming a source/drain electrode layer on the ohmic contact layer; patterning the active layer, the etch stopper layer, the ohmic contact layer and the source/drain electrode layer to form the active layer, an etch stopper, the ohmic contact layer, a source electrode and a drain electrode at predetermined patterns; and forming a pixel electrode connected with the drain electrode after forming a passivation film on the entire surface of the substrate including the source electrode and the drain electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Figure 1A:
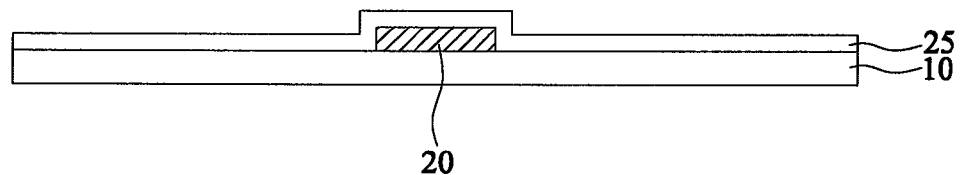
FIGS. 1A to 1E are cross-sectional views illustrating process steps of manufacturing a thin film transistor substrate by crystallizing an active layer using a laser according to the related art.
Figure 1B:
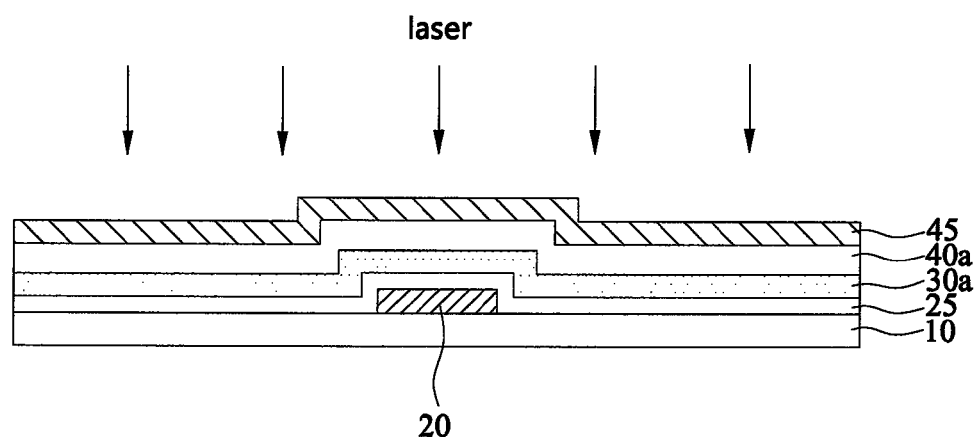
Figure 1C:
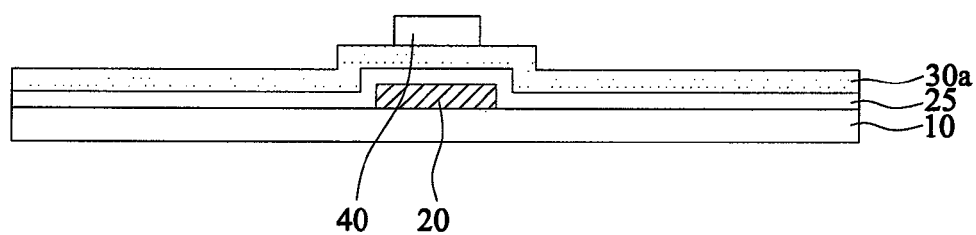
Figure 1D:
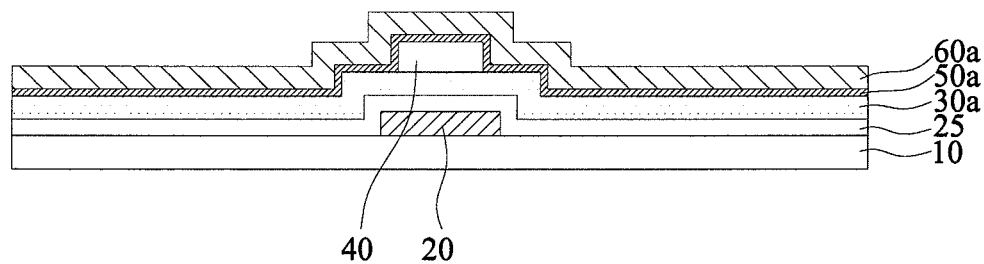
Figure 1E:
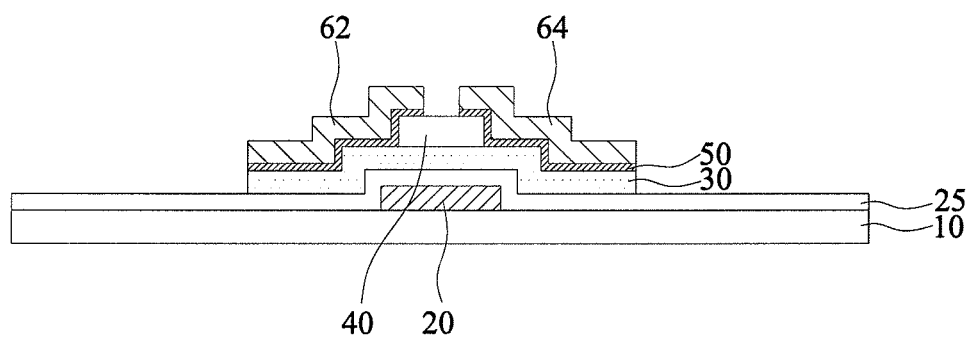
Figure 2A:
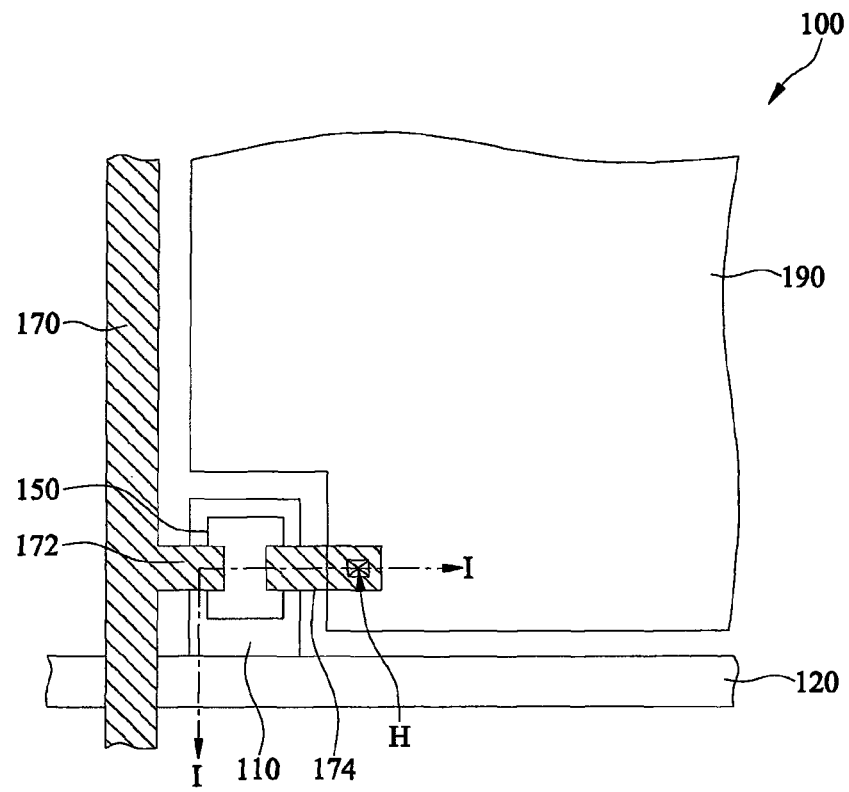
FIG. 2A is a plane view illustrating a thin film transistor substrate according to the first embodiment of the present invention and FIG. 2B is a cross-sectional view taken along line I-I of FIG. 2A.
Figure 2B:
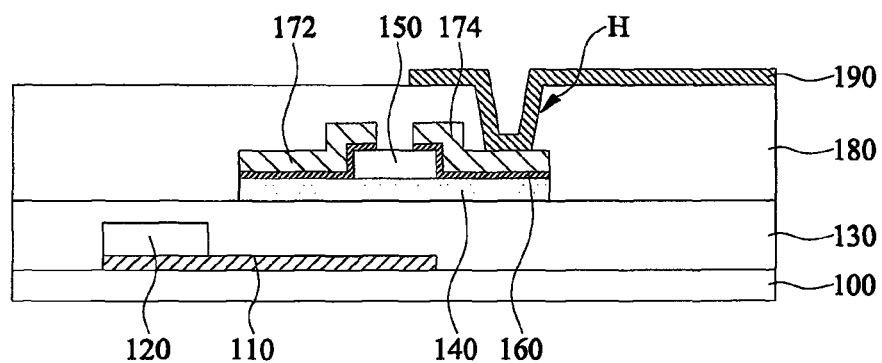

FIG. 2A is a plane view illustrating a thin film transistor substrate according to the first embodiment of the present invention and FIG. 2B is a cross-sectional view taken along line I-I of FIG. 2A.

As shown in FIG. 2A, a gate line 120 and a data line 170 are formed on a substrate 100 to cross each other.

A gate electrode 110 is connected to the gate line 120. The gate electrode 110 is formed at a layer different from the gate line 120, more specifically below the gate line 120.

A source electrode 172 is connected to the data line 170, and a drain electrode 174 is formed to face the source electrode 172 and spaced apart from the source electrode 172 at a predetermined interval. The source electrode 172 is forked from the data line 170.

Since an etch stopper 150 is formed at a channel region where the source electrode 172 and the drain electrode 174 are spaced apart from each other, an active layer formed below the etch stopper 150 is prevented from being etched.

A pixel electrode 190 is connected to the drain electrode 174. The pixel electrode 190 is connected with the drain electrode 174 through a predetermined contact hole H.

A sectional structure of the thin film transistor substrate according to the first embodiment of the present invention will be described with reference to FIG. 2B. The gate electrode 110 is formed on the substrate 100, and the gate line 120 is formed on the gate electrode 110. The gate line 120 is formed on one end of the gate electrode 110.

A gate insulating film 130 is formed on the entire surface of the substrate including the gate line 120.

An active layer 140 is formed on the gate insulating film 130. Although the active layer 140 is overlapped with the gate electrode 110 above the gate electrode 110, it is not overlapped with the gate line 120.

An etch stopper 150 is formed on the active layer 140, and an ohmic contact layer 160 is formed on the etch stopper 150. The ohmic contact layer 160 is not formed at the channel region.

The source electrode 172 and the drain electrode 174 are formed on the ohmic contact layer 160. The source electrode 172 is formed on one side of the ohmic contact layer 160, and the drain electrode 174 is formed on the other side of the ohmic contact layer 160.

In a plane structure, the entire pattern of the source and drain electrodes 172 and 174 is the same as that of the ohmic contact layer 160. Also, the active layer 140 is formed at the same pattern as that of the ohmic contact layer except that the active layer 140 is additionally formed at the channel region between the source electrode 172 and the drain electrode 174.

A passivation film 180 is formed on the source and drain electrodes 172 and 174. Since the passivation film 180 is provided with a contact hole H at a predetermined region, a predetermined region of the drain electrode 174 is exposed by the contact hole H.

The passivation film 180 may be made of an inorganic film such as SiOx or SiNx, or may be made of an organic film such as acryl. Also, the passivation film 180 may be made of a multi-layered film of two or more layers. At this time, the multi-layered film may be made of inorganic films only, or may be made of a mixture film of an inorganic film and an organic film.

The pixel electrode 190 is formed on the passivation film 180. The pixel electrode 190 is connected with the drain electrode 174 through the contact hole H provided in the passivation film 180.

As described above, in the first embodiment of the present invention, since the gate electrode 110 and the gate line 120 are formed as separate layers, even though the gate electrode 110 is formed at a thin thickness, the problem that resistance of the gate electrode 110 is increased may be solved through the gate line 120 of a low resistance line. In other words, the gate electrode 110 to which a laser is irradiated is formed thinly to prevent a crack from occurring in the gate insulating film 130, and the gate electrode 110 is connected to the gate line 120 having a relatively thick thickness, thereby making resistance of the gate electrode 110 lower.

Accordingly, the gate electrode 110 is formed at a relatively thinner thickness than the thickness of the gate line 120. For example, the gate electrode 110 may be formed at a thickness of 1000 Å or less, and the gate line 120 may be formed at a thickness of 2500 Å to 3000 Å.

The above characteristics may be understood more easily with reference to the manufacturing process which will be described later.

FIGS. 3A to 3L are cross-sectional views illustrating process steps of a method for manufacturing a thin film transistor substrate according to the first embodiment of the present invention, and correspond to the section of line I-I of FIG. 2A.

Figure 3A:
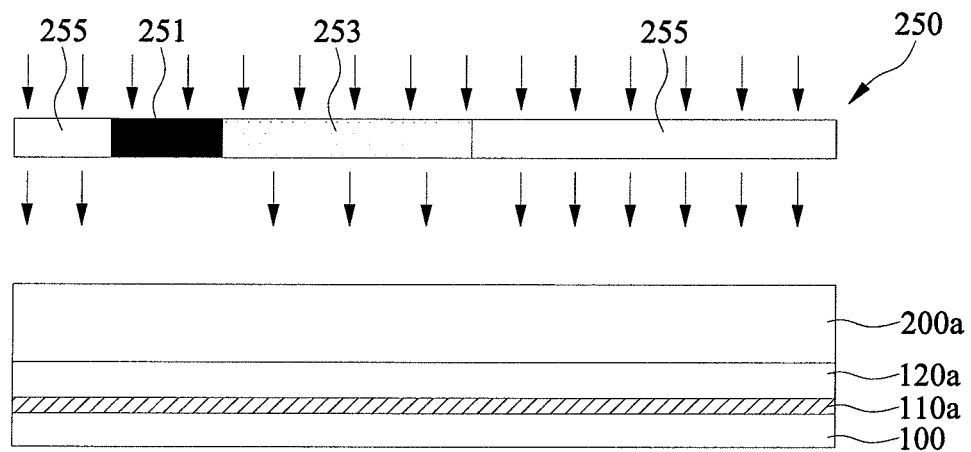
FIGS. 3A to 3L are cross-sectional views illustrating process steps of a method for manufacturing a thin film transistor substrate according to the first embodiment of the present invention.

First of all, as shown in FIG. 3A, after a gate electrode layer 110a is formed on the substrate 100, a gate line layer 120a is formed on the gate electrode layer 110a, and a photoresist layer 200a is formed on the gate line layer 120a, light is irradiated onto the photoresist layer 200a by using a half-tone mask 250.

The half-tone mask 250 includes a non-transmissive region 251 through which light is not transmitted, a semi-transmissive region 253 through which light is partially transmitted, and a transmissive region 255 through which light is fully transmitted.

Figure 3B:
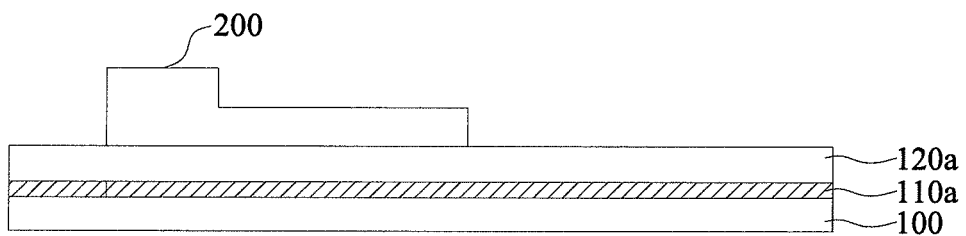

Next, as shown in FIG. 3B, the photoresist layer 200a to which light is irradiated is developed to form a photoresist pattern 200.

If the photoresist layer 200a is developed, the photoresist layer corresponding to the non-transmissive region 251 of the half-ton mask 250 remains as it is, the photoresist layer corresponding to the semi-transmissive region 253 of the half-tone mask 250 partially remains, and the photoresist layer corresponding to the transmissive region 255 of the half-tone mask 250 is fully removed.

Figure 3C:
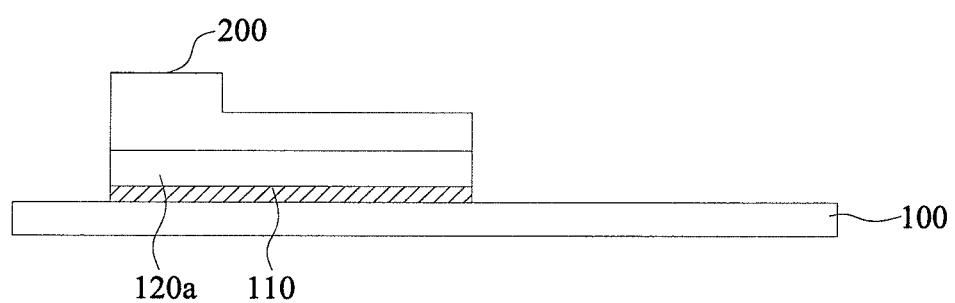

Next, as shown in FIG. 3C, the gate electrode layer 110a and the gate line layer 120a are etched using the photoresist pattern 200 as a mask. As a result, the gate electrode 110 pattern is formed.

Figure 3D:
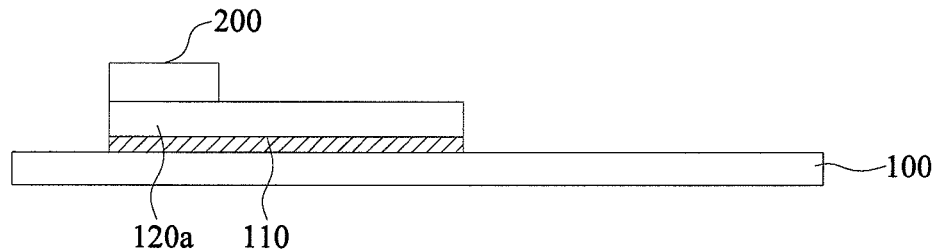

Then, as shown in FIG. 3D, the photoresist pattern 200 is ashed. As a result, the width and height of the photoresist pattern 200 are reduced, whereby the portion corresponding to the non-transmissive region 251 of the half-tone mask 250 remains only.

Figure 3E:
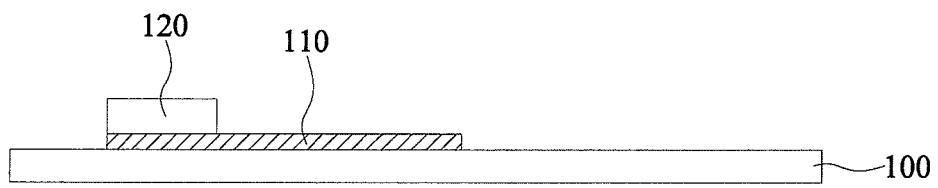

Next, as shown in FIG. 3E, after the gate line layer 120a is additionally etched using the ashed photoresist pattern 200 as a mask, the photoresist pattern 200 is stripped. As a result, the gate line 120 pattern is formed.

As described above, the gate electrode 110 and the gate line 120 may be formed on the substrate 100 at different patterns through a half-tone mask process (first mask process) based on FIGS. 3A to 3E. However, the present invention is not limited to the above process, and after the gate electrode 110 is patterned on the substrate 100 through a mask process, the gate line 120 may be patterned through a separate mask process.

In this specification, the "mask process" means a series of processes of depositing a material layer for a pattern, depositing a photoresist layer on the material layer, forming a photoresist pattern by exposing and developing the photoresist layer using a mask, forming a predetermined pattern by etching the material layer using the photoresist pattern, and stripping the photoresist pattern.

Figure 3F:
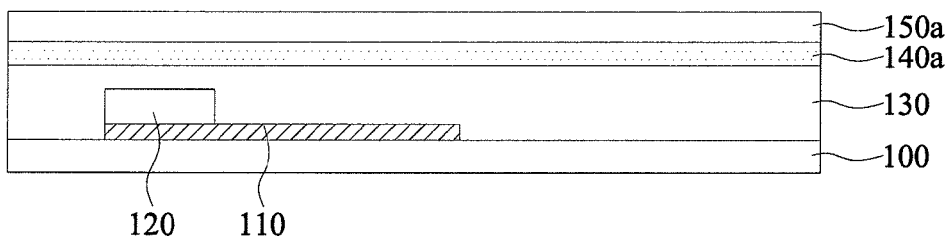

Next, as shown in FIG. 3F, the gate insulating film 130 is formed on the gate line 120, an active layer 140a is formed on the gate insulating film 130, and an etch stopper layer 150a is formed on the active layer 140a.

Figure 3G:
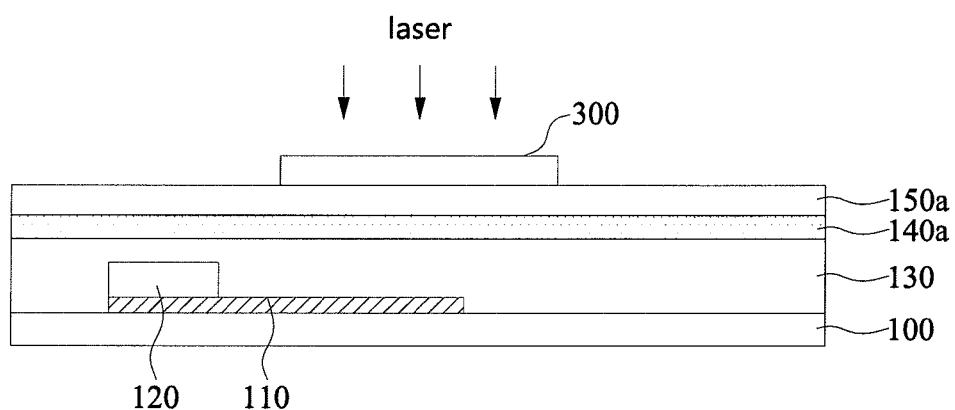

As shown in FIG. 3G, after a heat transfer layer 300 is formed on the etch stopper layer 150a, the active layer 140a is crystallized by irradiating a laser.

An infrared laser may be used as the laser.

Since the active layer 140a is finally formed at a predetermined pattern, it is not required that the active layer 140a should fully be crystallized by irradiating the laser, and only a predetermined region of the active layer 140a is crystallized considering the final pattern. Accordingly, the heat transfer layer 300, which serves to transfer energy of the laser to the active layer 140a, is patterned considering the crystallized region of the active layer 140a.

Also, if the laser is irradiated to the gate line 120, since stress is given to the gate line 120, a crack may occur in the gate insulating film 130 formed on the gate line 120, whereby it is required not to irradiate the laser to the gate line 120. Accordingly, the heat transfer layer 300 is preferably patterned so as not to overlap the gate line 120.

As described above, according to the present invention, since the infrared laser is irradiated to the gate electrode 110 in view of the position of the gate electrode 110, the gate electrode 110 is thinly formed to prevent a crack from occurring in the gate insulating film 130 formed on the gate electrode 110. Since the infrared laser is not irradiated to the gate line 120, the gate line 120 is formed thickly to prevent resistance of the gate electrode 110 from being increased.

The process of patterning the heat transfer layer 300 so as not to overlap the gate line 120 considering the crystallized region of the active layer 140a may be performed using the aforementioned mask process (second mask process).

The heat transfer layer 300 may be made of metal such as molybdenum.

Figure 3H:
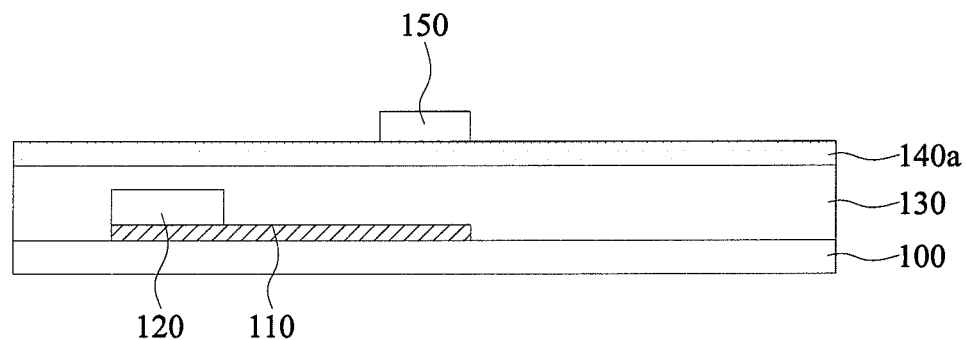

Next, as shown in FIG. 3H, after the heat transfer layer 300 is removed, the etch stopper layer 150a is patterned to form a predetermined etch stopper 150.

The etch stopper 150 may be patterned using the aforementioned mask process (third mask process).

Figure 3I:
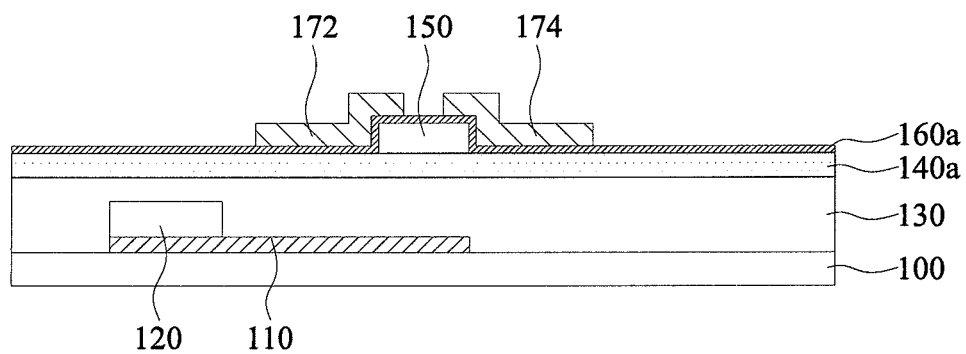

Next, as shown in FIG. 3I, an ohmic contact layer 160a is formed on the entire surface of the substrate including the etch stopper 150, and the source electrode 172 and the drain electrode 174 are formed on the ohmic contact layer 160a.

The source electrode 172 and the drain electrode 174 may be patterned to be spaced apart from each other at a predetermined interval by using the aforementioned mask process (fourth mask process).

Figure 3J:
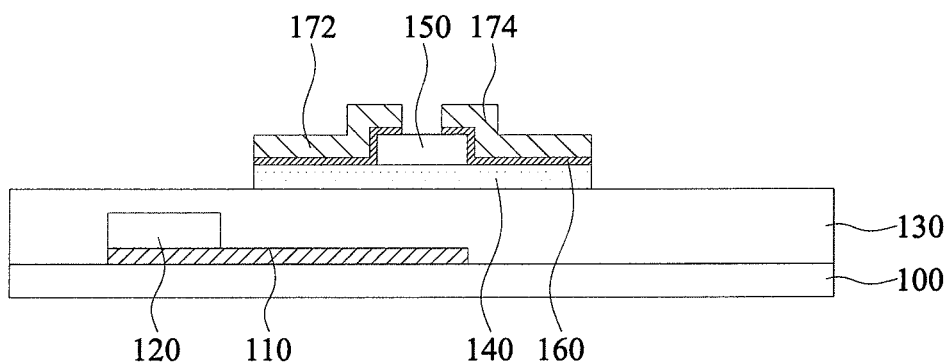

Next, as shown in FIG. 3J, the active layer 140a and the ohmic contact layer 160a are etched using the source and drain electrodes 172 and 174 as masks.

In this case, although the ohmic contact layer 160a and the active layer 140a are etched together at the region where the etch stopper 150 is not formed, the ohmic contact layer 160a is only etched at the channel region where the etch stopper 150 is formed, whereby a predetermined ohmic contact layer 160 pattern and a predetermined active layer 140 pattern are formed.

Figure 3K:
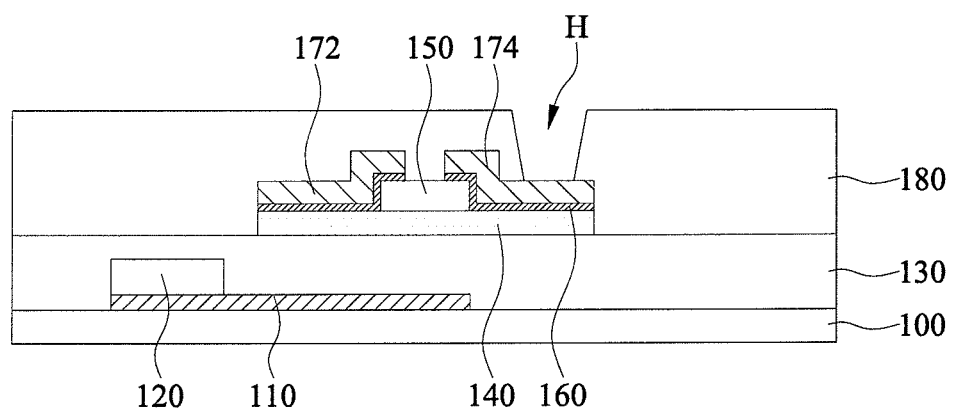

Next, as shown in FIG. 3K, the passivation film 180 is formed on the entire surface of the substrate including the source and drain electrodes 172 and 174, and the contact hole H is formed in the passivation film 180 to expose the drain electrode 174.

The process of forming the contact hole H in the passivation film 180 may be performed using the aforementioned mask process (fifth mask process).

Figure 3L:
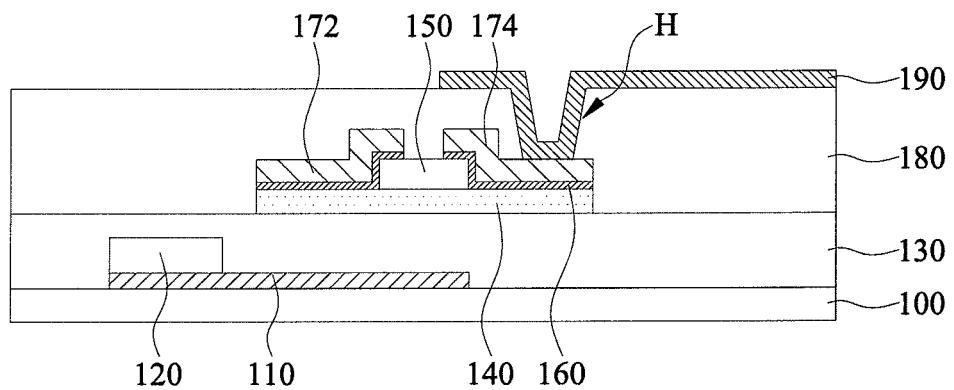

Next, as shown in FIG. 3L, the pixel electrode 190 is formed on the passivation film 180.

The pixel electrode 190 is patterned to be connected with the drain electrode 174 through the contact hole H, and the process of forming the pattern of the pixel electrode 190 may be performed using the aforementioned mask process (sixth mask process).

Meanwhile, it is noted that the thin film transistor substrate according to the first embodiment of the present invention is manufactured through a total of six mask processes including the half-tone mask process of one time. The mask process has problems in that it generally needs an expensive mask to increase the cost and process steps are complicated to lower productivity.

Hereinafter, a thin film transistor substrate and a method for manufacturing the same according to another embodiment of the present invention, which can reduce a number of mask process times, will be described.

Figure 4A:
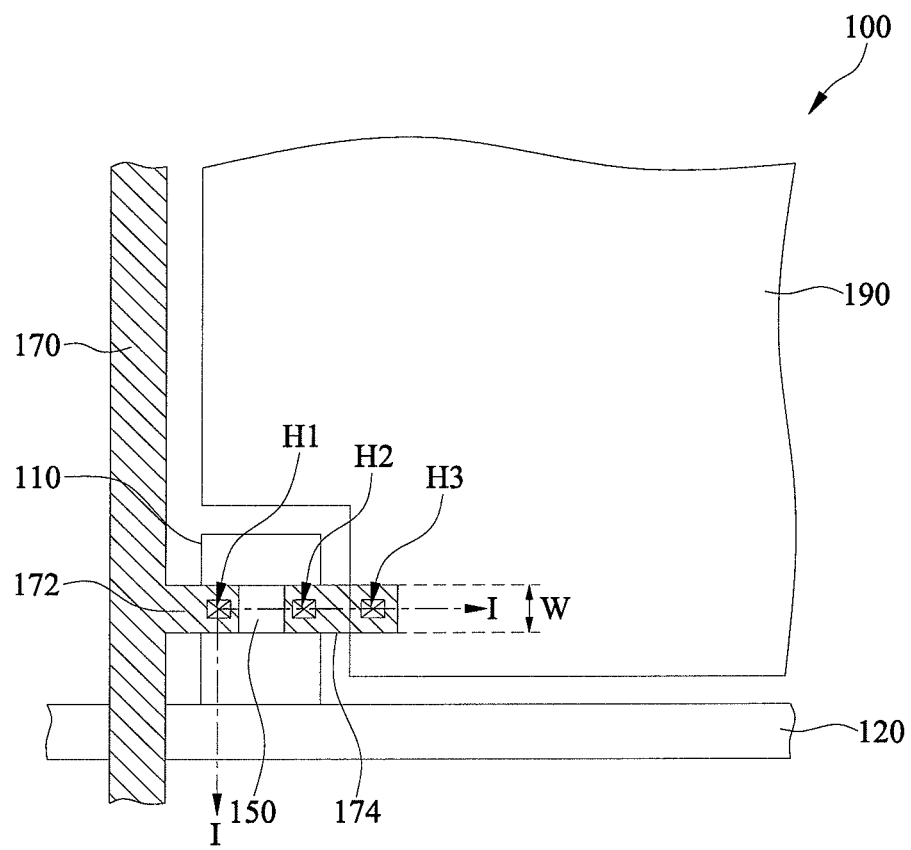
FIG. 4A is a plane view illustrating a thin film transistor substrate according to the second embodiment of the present invention and FIG. 4B is a cross-sectional view taken along line I-I of FIG. 4A.
Figure 4B:
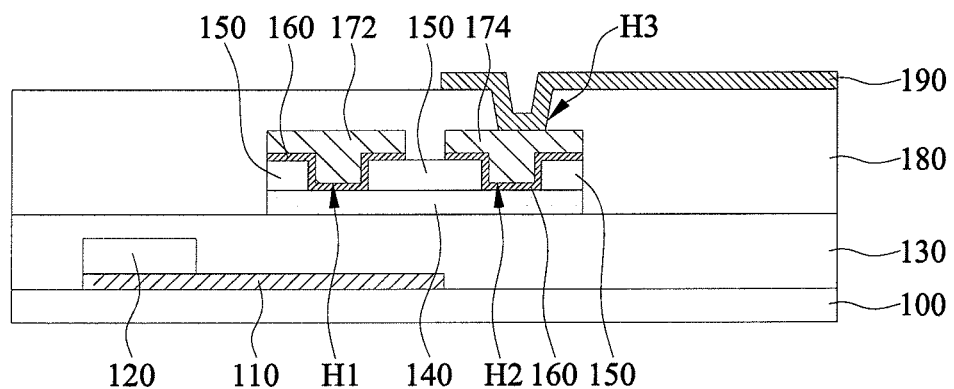

FIG. 4A is a plane view illustrating a thin film transistor substrate according to the second embodiment of the present invention and FIG. 4B is a cross-sectional view taken along line I-I of FIG. 4A.

As shown in FIG. 4A, a gate line 120 and a data line 170 are formed on a substrate 100 to cross each other.

A gate electrode 110 is connected to the gate line 120, and is formed below the gate line 120.

A source electrode 172 is connected to the data line 170, and a drain electrode 174 is formed to face the source electrode 172 and spaced apart from the source electrode 172 at a predetermined interval. The source electrode 172 is forked from the data line 170.

An etch stopper 150 is formed at a channel region where the source electrode 172 and the drain electrode 174 are spaced apart from each other.

The etch stopper 150 is formed below the source electrode 172 and the drain electrode 174 at the same width W as the widths of the source electrode 172 and the drain electrode 174. Also, since the etch stopper 150 is provided with a first contact hole H1 and a second contact hole H2, an active layer below the etch stopper 150 is exposed by the first contact hole H1 and the second contact hole H2. This structure of the etch stopper 150 may be understood more easily with reference to a sectional structure and process steps, which will be described later.

A pixel electrode 190 is connected to the drain electrode 174. The pixel electrode 190 is connected with the drain electrode 174 through a third contact hole H3.

A sectional structure of the thin film transistor substrate according to the second embodiment of the present invention will be described with reference to FIG. 4B. The gate electrode 110 is formed on the substrate 100, and the gate line 120 is formed on the gate electrode 110. The gate line 120 is formed on one end of the gate electrode 110.

A gate insulating film 130 is formed on the entire surface of the substrate including the gate line 120, and an active layer 140 is formed on the gate insulating film 130. Although the active layer 140 is overlapped with the gate electrode 110 above the gate electrode 110, it is not overlapped with the gate line 120.

An etch stopper 150 is formed on the active layer 140. Since the etch stopper 150 is provided with the first contact hole H1 and the second contact hole H2, a predetermined region of the active layer 140 is exposed by the first contact hole H1 and the second contact hole H2.

An ohmic contact layer 160 is formed on the etch stopper 150. The ohmic contact layer 160 is not formed at the channel region and is connected with the active layer 140 through the first contact hole H1 and the second contact hole H2.

The source electrode 172 and the drain electrode 174 are formed on the ohmic contact layer 160. The source electrode 172 is formed on the ohmic contact layer 160 connected with the active layer 140 through the first contact hole H1, and the drain electrode 174 is formed on the ohmic contact layer 160 connected with the active layer 140 through the second contact hole H2.

In a plane structure, the entire pattern of the source and drain electrodes 172 and 174 is the same as that of the ohmic contact layer 160. Also, the active layer 140 is formed at the same pattern as that of the ohmic contact layer 160 except that the active layer 140 is additionally formed at the channel region between the source electrode 172 and the drain electrode 174.

A passivation film 180 is formed on the source and drain electrodes 172 and 174. Since the passivation film 180 is provided with the third contact hole H3, a predetermined region of the drain electrode 174 is exposed by the third contact hole H3.

The passivation film 180 may be made of a single film of an inorganic film or an organic film, or may be made of a multi-layered film of an inorganic film and/or an organic film.

The pixel electrode 190 connected with the drain electrode 174 through the third contact hole H3 is formed on the passivation film 180.

In the same manner as the first embodiment, in the second embodiment of the present invention, since the gate electrode 110 is formed thinly and the gate line 120 is formed thickly as a separate layer different from the gate electrode layer 110, the problem that a crack occurs in the gate insulating film 130 during irradiation of the laser may be solved and resistance of the gate electrode 110 may be reduced.

Hereinafter, a method for manufacturing the thin film transistor substrate according to the second embodiment of the present invention will be described.

FIGS. 5A to 5K are cross-sectional views illustrating process steps of a method for manufacturing a thin film transistor substrate according to the second embodiment of the present invention, and correspond to the section of line I-I of FIG. 4A.

Figure 5A:
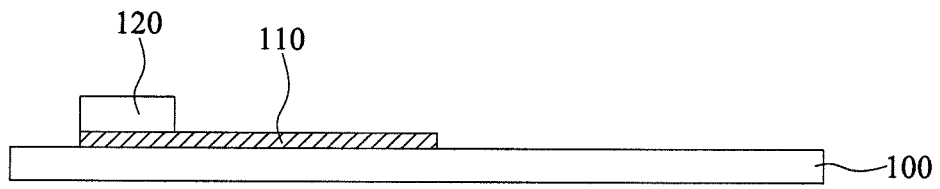
FIGS. 5A to 5K are cross-sectional views illustrating process steps of a method for manufacturing a thin film transistor substrate according to the second embodiment of the present invention.

First of all, as shown in FIG. 5A, the gate electrode 110 is patterned on the substrate 100, and the gate line 120 is patterned on the gate electrode 110.

The gate electrode 110 and the gate line 120 may be formed by the same method as that according to the first embodiment. In other words, the gate electrode 110 and the gate line 120 may be patterned using the half-tone mask process (first mask process) shown in FIGS. 3A to 3E.

Figure 5B:
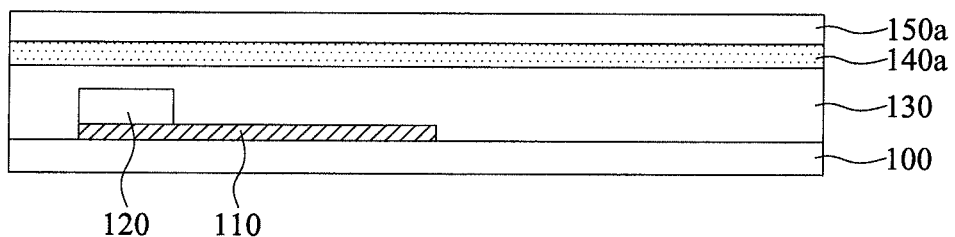

Next, as shown in FIG. 5B, a gate insulating film 130 is formed on the gate line 120, an active layer 140a is formed on the gate insulating film 130, and an etch stopper layer 150a is formed on the active layer 140a.

Figure 5C:
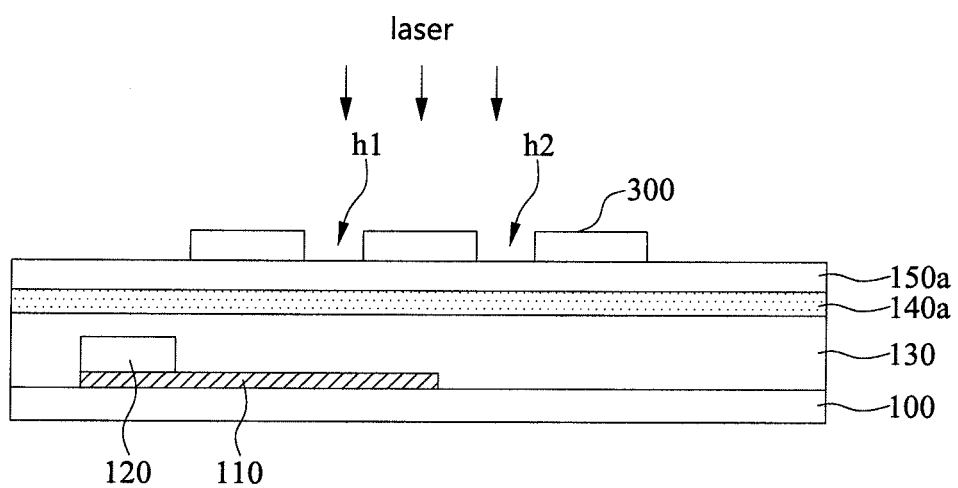

As shown in FIG. 5C, after a heat transfer layer 300 is formed on the etch stopper layer 150a, the active layer 140a is crystallized by irradiating a laser.

In the same manner as the first embodiment, it is not required that the active layer 140a should fully be crystallized, and only a predetermined region of the active layer 140a is crystallized considering a final pattern. Accordingly, the heat transfer layer 300 is patterned considering the crystallized region of the active layer 140a.

Also, it is required that the laser should not be irradiated to the gate line 120 to prevent a crack from occurring in the gate insulating film 130. Accordingly, the heat transfer layer 300 is patterned so as not to overlap the gate line 120.

Also, as will be aware of it from the following process, the heat transfer layer 300 serves as a mask for forming the etch stopper pattern. To this end, the heat transfer layer 300 is patterned to have a first slit h1 and a second slit h2. As described above, even though the heat transfer layer 300 is provided with the first slit h1 and the second slit h2, if the sizes of the slits h1 and h2 are controlled appropriately, energy of the laser may be transferred to the active layer 140a below the slits h1 and h2, whereby there is no problem in crystallization of the active layer 140a.

The aforementioned heat transfer layer 300 may be formed by the aforementioned mask process (second mask process) using metal such as molybdenum.

Figure 5D:
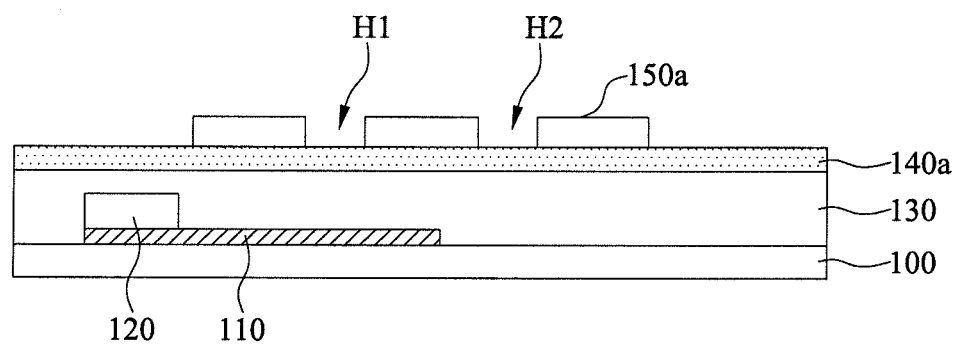

Next, as shown in FIG. 5D, after the etch stopper layer 150a below the heat transfer layer 300 is etched using the heat transfer layer 300 as a mask, the heat transfer layer 300 is removed. As a result, the etch stopper layer 150a having the first contact hole H1 corresponding to the first slit h1 and the second contact hole H2 corresponding to the second slit h2 is formed.

Figure 5E:
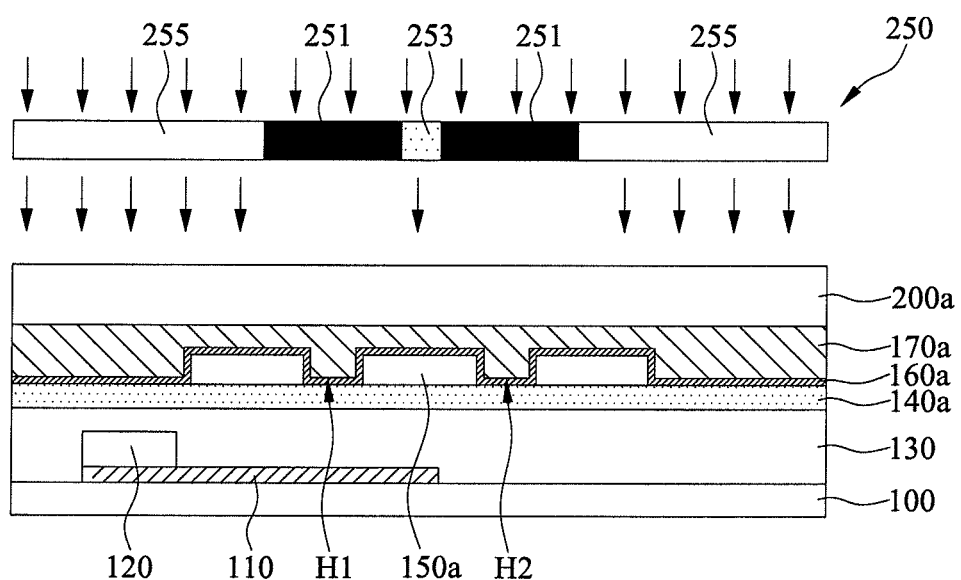

Next, as shown in FIG. 5E, after an ohmic contact layer 160a is formed on the entire surface of the substrate including the etch stopper 150a, a source/drain electrode layer 170a is formed on the ohmic contact layer 160a, and a photoresist layer 200a is formed on the source/drain electrode layer 170a, light is irradiated onto the photoresist layer 200a by using a half-tone mask 250.

The half-tone mask 250 includes a non-transmissive region 251 through which light is not transmitted, a semi-transmissive region 253 through which light is partially transmitted, and a transmissive region 255 through which light is fully transmitted.

Figure 5F:
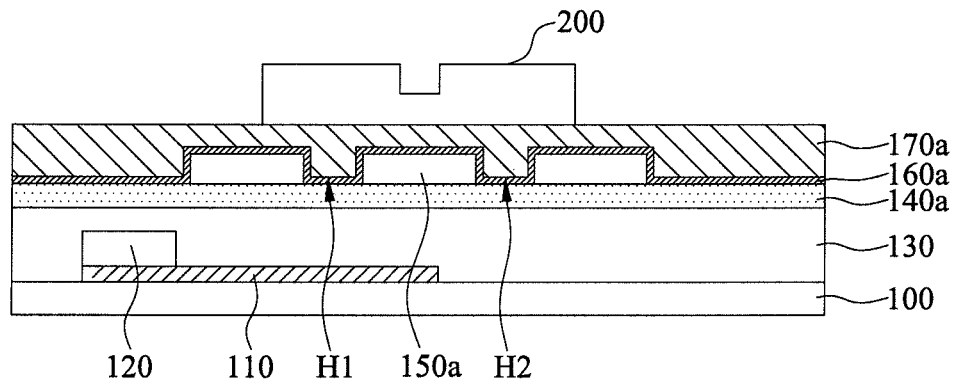

Next, as shown in FIG. 5F, the photoresist layer 200a to which light is irradiated is developed to form a photoresist pattern 200.

If the photoresist layer 200a is developed, the photoresist layer corresponding to the non-transmissive region 251 of the half-ton mask 250 remains as it is, the photoresist layer corresponding to the semi-transmissive region 253 of the half-tone mask 250 partially remains, and the photoresist layer corresponding to the transmissive region 255 of the half-tone mask 250 is fully removed.

Figure 5G:
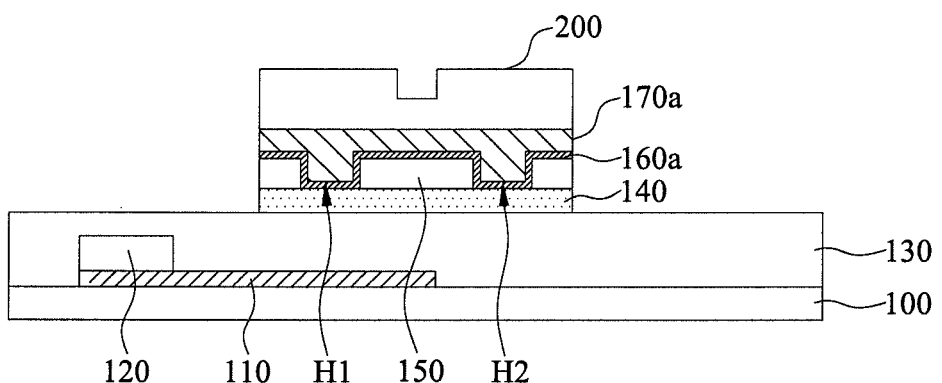

Next, as shown in FIG. 5G, the active layer 140a, the etch stopper layer 150a, the ohmic contact layer 160a, and the source/drain electrode layer 170a are etched using the photoresist pattern 200 as a mask. As a result, the active layer 140 pattern and the etch stopper 150 pattern are formed.

Figure 5H:
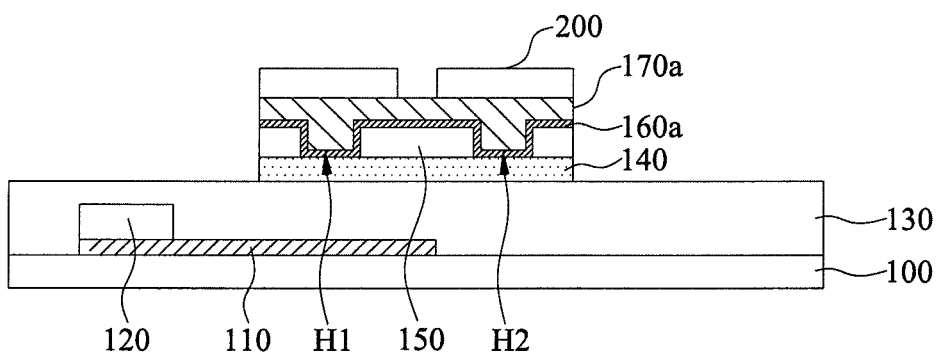

Then, as shown in FIG. 5H, the photoresist pattern 200 is ashed. As a result, the width and height of the photoresist pattern 200 are reduced, whereby the portion corresponding to the non-transmissive region 251 of the half-tone mask 250 remains only.

Figure 5I:
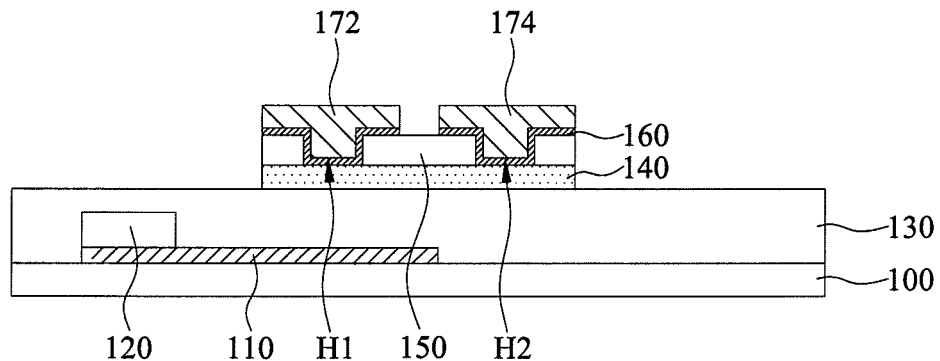

Next, as shown in FIG. 5I, after the source/drain electrode layer 170a and the ohmic contact layer 160a are additionally etched using the ashed photoresist pattern 200 as a mask, the photoresist pattern 200 is stripped. As a result, the ohmic contact layer 160 pattern, the source electrode 172 pattern and the drain electrode 174 pattern are formed.

As described above, the active layer 140, the etch stopper 150, the ohmic contact layer 160, the source electrode 172 and the drain electrode 174 may be patterned through the half-tone mask process (third mask process) based on FIGS. 5E to 5I.

Figure 5J:
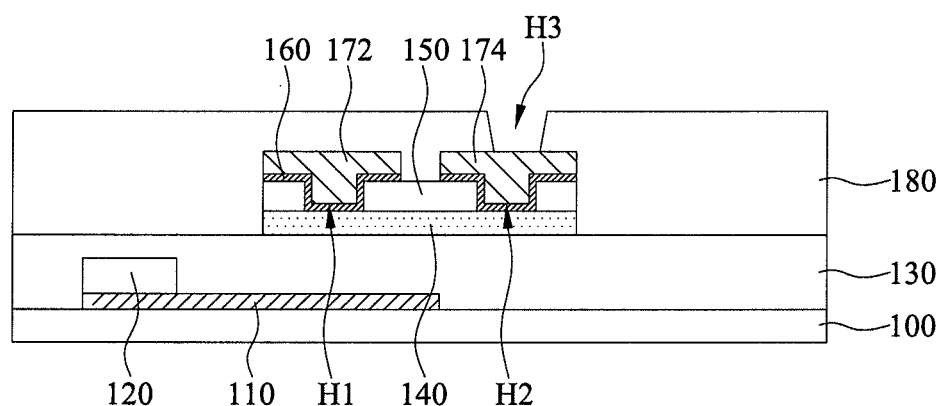

Next, as shown in FIG. 5J, the passivation film 180 is formed on the entire surface of the substrate including the source and drain electrodes 172 and 174, and the third contact hole H3 is formed in the passivation film 180 to expose the drain electrode 174.

The process of forming the third contact hole H3 in the passivation film 180 may be performed using the aforementioned mask process (fourth mask process).

Figure 5K:
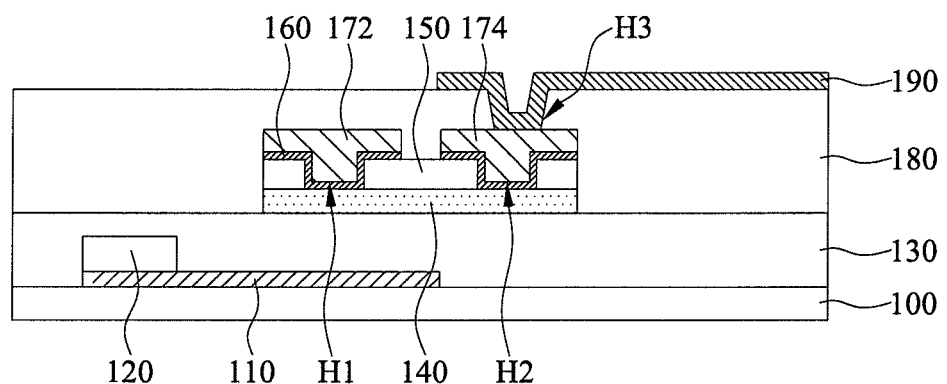

Next, as shown in FIG. 5K, the pixel electrode 190 is formed on the passivation film 180.

The pixel electrode 190 is patterned to be connected with the drain electrode 174 through the third contact hole H3, and the process of forming the pattern of the pixel electrode 190 is performed using the aforementioned mask process (fifth mask process).

It is noted that the thin film transistor substrate according to the second embodiment of the present invention is manufactured through a total of five mask processes including the half-tone mask process of two times. In this case, the mask process is reduced by one time as compared with the first embodiment, whereby the cost may be reduced and productivity may be improved.

Also, according to the second embodiment of the present invention, since the active layer 140, the etch stopper 150, the ohmic contact layer 160, the source electrode 172 and the drain electrode 174 are patterned using the half-tone mask, the entire region of the thin film transistor may be minimized, whereby an aperture ratio of the display device may be increased.

As described above, according to the present invention, the following advantages can be obtained.

Since the gate electrode and the gate line are formed as separate layers different from each other, the gate electrode to which the laser is irradiated is formed at a thin thickness and the gate line to which the laser is not irradiated is formed at a thick thickness, whereby a crack may be prevented from occurring in the gate insulating film during irradiation of the laser and resistance of the gate electrode may be prevented from being increased.

Also, since the heat transfer layer that transfers energy of the laser to the active layer is used as a mask for forming the etch stopper pattern, the number of mask process times may be reduced, whereby the cost may be reduced and productivity may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
   a gate line and a data line arranged on a substrate to cross each other;
   a gate electrode connected with the gate line below the gate line;
   an active layer formed on the gate electrode;
   a gate insulating film between the gate electrode and the active layer;
   an etch stopper formed on the active layer;
   an ohmic contact layer formed on the etch stopper;
   source and drain electrodes formed on the ohmic contact layer; and
   a pixel electrode connected with the drain electrode,
   wherein a first portion of the gate electrode is formed directly under the gate line and a second portion of the gate electrode is formed directly under the gate insulating film.

2. The thin film transistor substrate of claim 1, wherein the gate electrode is formed at a thickness thinner than that of the gate line.

3. The thin film transistor substrate of claim 1, wherein the active layer is formed so as not to overlap the gate line.

4. The thin film transistor substrate of claim 1, wherein the etch stopper is provided with a first contact hole and a second contact hole to expose a predetermined region of the active layer, and the ohmic contact layer is connected with the active layer through the first contact hole and the second contact hole.

5. The thin film transistor substrate of claim 1, wherein the etch stopper is formed to have the same width as that of the source and drain electrodes.

6. The thin film transistor substrate of claim 1, wherein the ohmic contact layer is formed at the same pattern as that of the source and drain electrodes.

\* \* \* \* \*